(12) United States Patent
Venkatasubramanian et al.

(10) Patent No.: US 8,977,878 B2
(45) Date of Patent: Mar. 10, 2015

(54) REDUCING CURRENT LEAKAGE IN L1 PROGRAM MEMORY

(75) Inventors: Ramakrishnan Venkatasubramanian, Plano, TX (US); Hung Vi Ong, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 463 days.

(21) Appl. No.: 13/111,617

(22) Filed: May 19, 2011

(65) Prior Publication Data

US 2012/0297225 A1 Nov. 22, 2012

(51) Int. Cl.
G06F 1/32 (2006.01)
G06F 1/00 (2006.01)
G06F 1/26 (2006.01)
G06F 13/00 (2006.01)
G11C 5/14 (2006.01)

(52) U.S. Cl.
CPC ............ G06F 1/3225 (2013.01); G06F 1/3275 (2013.01); G11C 5/148 (2013.01); Y02B 60/1225 (2013.01)
USPC ........... 713/323; 713/300; 713/320; 711/118; 711/119

(58) Field of Classification Search
None
See application file for complete search history.

(56) References Cited

U.S. PATENT DOCUMENTS

| | | | |
|---|---|---|---|
| 6,574,682 B1 * | 6/2003 | Chan | 710/22 |
| 7,475,261 B2 * | 1/2009 | Totsuka et al. | 713/300 |
| 7,870,407 B2 * | 1/2011 | Branover et al. | 713/323 |
| 2003/0149902 A1 * | 8/2003 | Silla et al. | 713/300 |
| 2006/0049800 A1 * | 3/2006 | Reed et al. | 320/128 |
| 2006/0161735 A1 * | 7/2006 | Kiyota et al. | 711/129 |
| 2010/0042786 A1 * | 2/2010 | Bell et al. | 711/121 |
| 2010/0073074 A1 * | 3/2010 | Bertram et al. | 327/534 |
| 2010/0182867 A1 * | 7/2010 | Lee | 365/226 |
| 2011/0058439 A1 * | 3/2011 | Lee et al. | 365/227 |
| 2011/0066872 A1 * | 3/2011 | Miller et al. | 713/340 |
| 2011/0154079 A1 * | 6/2011 | Dixon et al. | 713/323 |
| 2011/0291748 A1 * | 12/2011 | Li et al. | 327/544 |
| 2011/0296211 A1 * | 12/2011 | Ramaraju et al. | 713/320 |
| 2012/0030482 A1 * | 2/2012 | Russell et al. | 713/300 |
| 2012/0226927 A1 * | 9/2012 | Kagan et al. | 713/323 |

* cited by examiner

Primary Examiner — Ji H Bae
(74) Attorney, Agent, or Firm — Robert D. Marshall, Jr.; Frederick J. Telecky, Jr.

(57) ABSTRACT

An embodiment of the invention provides a method for decreasing power in an L1 program memory of a multi-level memory system. The power is decreased by enabling a sleep mode in the L1 program memory. The sleep mode determines when the L1 program memory will not be accessed for a period of time. When it is determined that the L1 program memory will not be accessed for a period of time, the voltage applied to the memory array is reduced. When it is determined that the L1 program memory will be accessed, the voltage applied to the memory array is increased.

3 Claims, 4 Drawing Sheets

REDUCING CURRENT LEAKAGE IN L1 PROGRAM MEMORY

BACKGROUND

As integrated circuits (ICs) become physically larger and more complex, the amount of power used by an IC increases. Power consumption in an IC may increase for several reasons. For example, the frequency at which an IC switches consumes power by charging and discharging capacitance on the IC. Increasing the switching frequency increases the power consumed on an IC. Power may also be consumed due to DC (direct current) conditions such as leakage in transistors and voltage dropped across resistors.

Power reduction may be achieved by reducing power supply voltages provided to the IC. For example, the voltage applied to an SRAM (Static Random Access Memory) may be reduced when the SRAM is not being accessed. Power may also be reduced by reducing the switching frequency. For example, in some circumstances a clock that is used to switch a particular circuit may be shut off or its frequency may be reduced.

Power reduction is particularly important in the design of DSP (Digital Signal Processor) ICs. DSP ICs usually have many transistors, wide data buses (data buses switch at very high frequencies and have a great deal of capacitance), and large memory arrays. The power used by large memory arrays may be reduced by putting them into a "sleep" state where the voltage applied to the array is reduced. However, it is important to manage when and how long large memory arrays are in the sleep mode. When large memory arrays are put into the sleep mode and taken out of the sleep mode too often, switching power is used that can negate the power saved by putting the large memory arrays in the sleep mode.

Power reduction is important in order to reduce the heating of an integrated circuit. Reducing the heating of an integrated circuit can lower the cost of packaging for an integrated circuit.

DETAILED DESCRIPTION

The drawings and description, in general, disclose a method and system for decreasing leakage power used in an L1 program memory. In one embodiment, leakage power is reduced in L1 program memory by activating a sleep mode operation when the program controller is idle and not accessing the L1 program memory. An arbiter determines when the L1 program memory will not be accessed by monitoring for a condition where no requestor requires access to the L1 program memory. A requestor can be a CPU (central processing unit) read, a DMA (direct memory access) read, a DMA write, an L2 return data write, an emulation read/write or a cache invalidation operation for example.

When the L1 program memory is in sleep mode, the voltage applied to the memory arrays in the L1 program memory is lowered. Because the voltage applied to the memory arrays is lowered, less leakage power is used. When the L1 program memory is taken out of the sleep mode, the voltage applied to the memory arrays is returned to the voltage used when accessing the L1 program memory. The voltage applied to the L1 program memory during the sleep mode may be lowered in several ways as will be discussed later.

The arbiter also determines how much power will be consumed by switching the L1 program memory to and from the sleep mode. When more power is used to switch the L1 program memory to and from the sleep mode than would be saved while the L1 program memory is in the sleep mode, the arbiter does not put the L1 program memory in the sleep mode.

Figure 1:
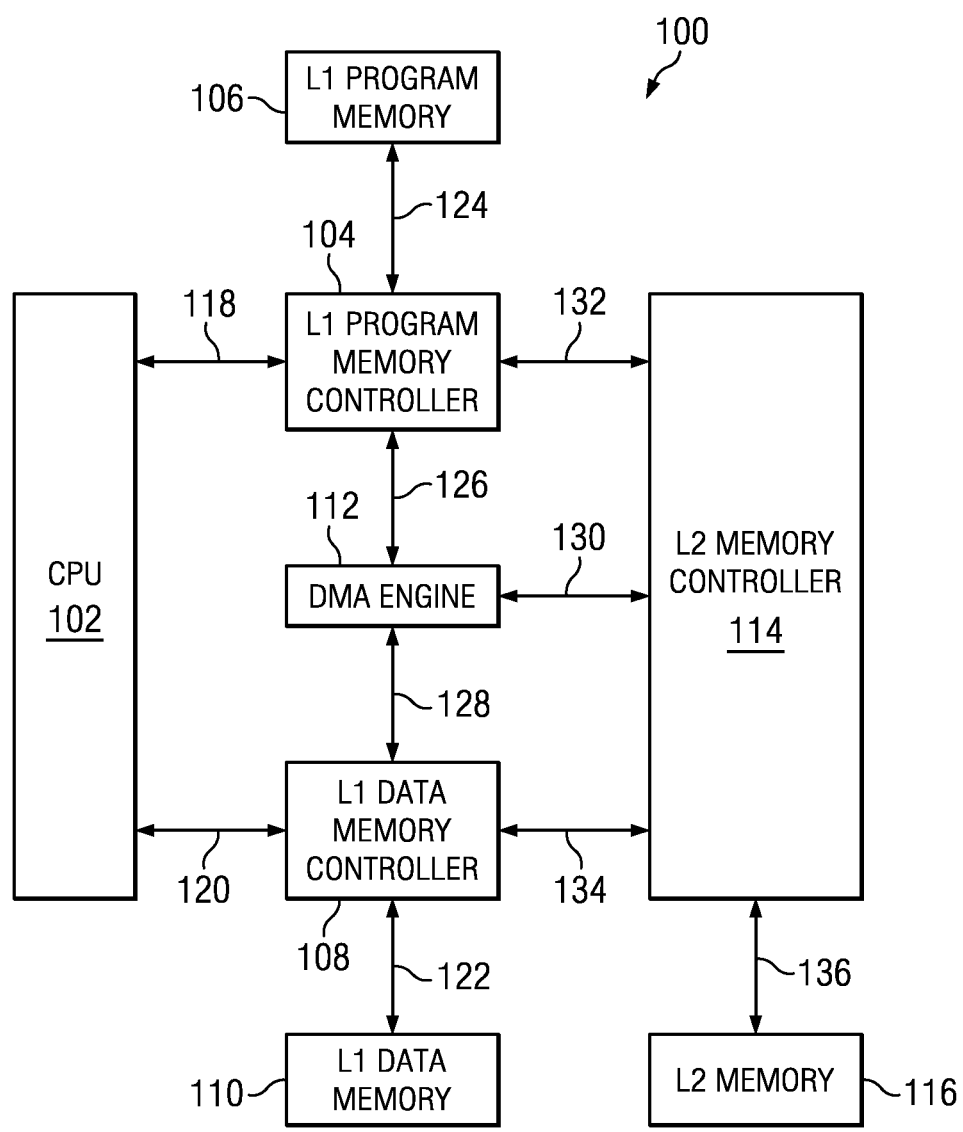
FIG. 1 is a block diagram of an embodiment of a CPU (central processing unit) with a multi-level memory system.

FIG. 1 is a block diagram of an embodiment of a CPU 102 with a multi-level memory system 100. In this embodiment of a CPU 102 with a multi-level memory system 100 a CPU 102 communicates with L1 program memory controller 104 through bi-directional bus 118. The CPU 102 also communicates with L1 data memory controller 108 through bi-directional bus 120. L1 program memory controller 104 communicates with L1 program memory 106 through bi-directional bus 124. L1 data memory controller 108 communicates with L1 data memory 110 through bi-directional bus 122.

Further in this example, L2 memory controller 114 communicates with L1 program memory controller 104 through bi-directional bus 132. L2 memory controller 114 communicates with L1 data memory controller 108 through bi-directional bus 134. L2 memory controller 114 also communicates with DMA (direct memory access) engine 112 through bi-directional bus 130. L2 memory controller 114 also communicates with L2 memory through bi-directional bus 136. DMA engine 112 communicates with L1 program memory controller 104 through bi-directional bus 126. DMA engine 112 also communicates with L1 data memory controller 108 through bi-directional bus 128.

In this example, the L1 program memory 106 has been used as a cache. However, part of the L1 program memory 106 may be used as direct mapped memory (SRAM mode). Part of the L1 program memory 106 may be configured in the SRAM mode and is memory mapped as such in the CPU 102. The CPU 102 can execute code from the direct mapped memory instead of using the hit/miss cache.

A cache is a component that transparently stores data so that future requests for that data can be served faster. The data that is stored within a cache might be values that have been computed earlier or duplicates of original values that are stored elsewhere. When requested data is contained in the cache (cache hit), this request can be served by reading the cache. When requested data is not contained in the cache (cache miss), the data has to be recomputed or fetched from its original storage location, which is comparatively slower than reading it from the cache. Hence, the more requests that can be served from the cache the faster the overall system performance may be.

When the CPU 102 makes a program request to the L1 program memory controller 104 and the program request address is present in the L1 program memory 106, a cache hit occurs. When a cache hit occurs, the L1 program memory controller 104 returns program information from the L1 program memory to the CPU 102. When the program request address is not present, a cache miss occurs. When a cache miss occurs, the L1 program memory controller requests a fetch address to the L2 memory controller 114.

The DMA engine 112 can transfer data to/from the L1 program memory 106 to any of the other internal memories. In addition, the DMA engine 112 can transfer data to/from internal memories to an external host (not shown). A DMA engine 112 transfer may occur in parallel with a CPU 102 program request.

When the L1 program memory is not being accessed (the L1 program memory is "idle"), the L1 program memory 106 continues to use power. For example, when the L1 program memory 106 is idle, power may be consumed through leakage mechanisms associated with active transistors (e.g. junction leakage). Leakage power may be reduced by controlling the voltage (bias) applied to array(s) in the L1 program memory 106. In technologies that have a minimum feature size of 40 nanometers or smaller, the leakage power consumed is greater than the dynamic power consumed (approximately 60 percent of the power used is leakage power and 40 percent is dynamic power).

Figure 2:
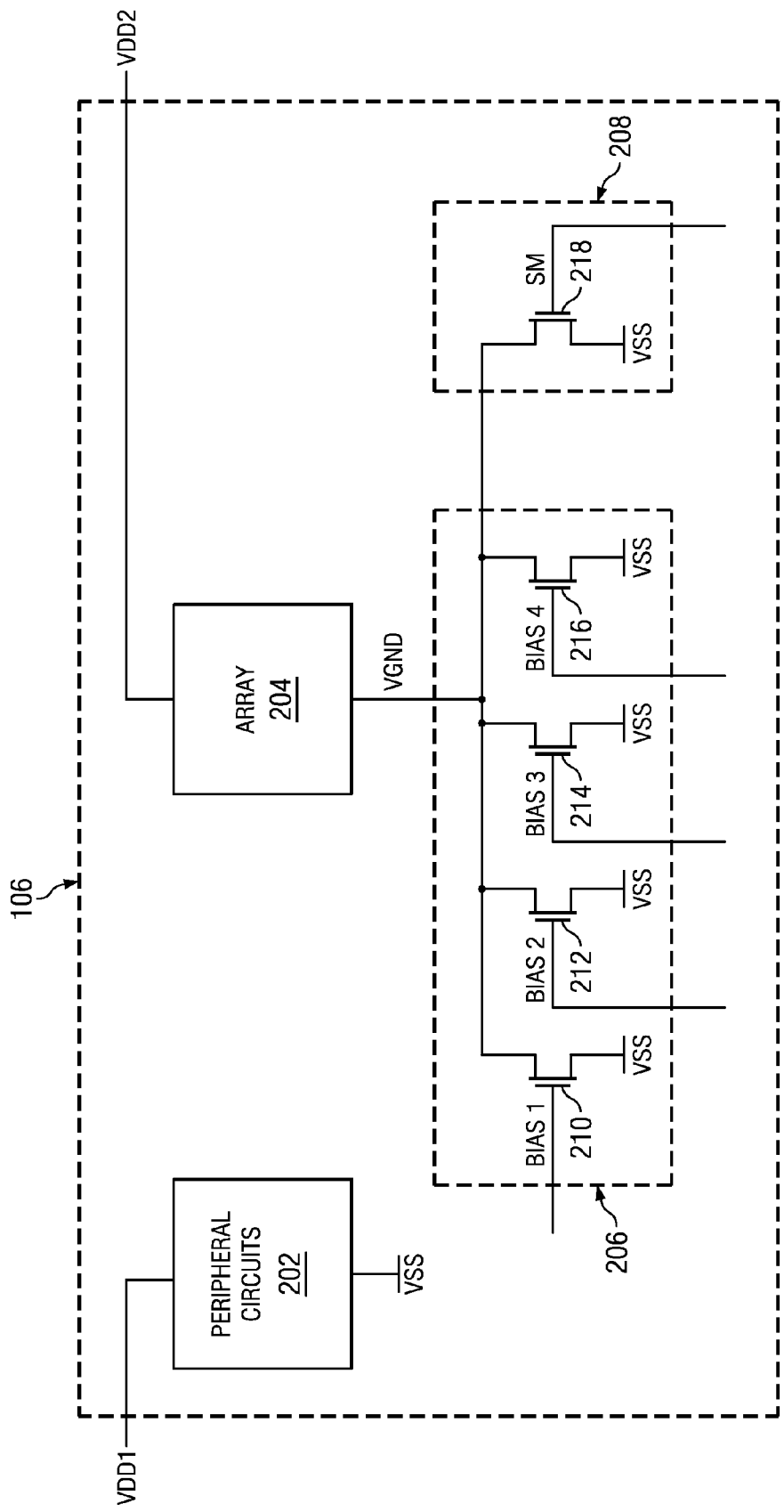
FIG. 2 is a block diagram of an embodiment of an L1 program memory with array bias control.

FIG. 2 is a block diagram of an embodiment of an L1 program memory 106 with array bias control. In this example, the peripheral circuits 202 (i.e. word-line decoders, bit-line decoders, sense amps, etc.) have voltages VDD1 and VSS applied to them. The array 204 has a positive voltage VDD2 applied with a ground bias circuit 206 electrically connected between the array 204 and the negative voltage VSS. In this example, the voltage at node VGND is controlled when the L1 program memory 106 is be accessed by turning on combinations of NMOSFETs (n-type metal-oxide semiconductor field-effect transistor) 210, 212, 214 and 216.

For example, when all four NMOSFETS 210, 212, 214 and 216 are turned on, the gates (bias1, bias2, bias3, bias4) of each NMOSFET are driven to a logical high value. Because all the gates (bias1, bias2, bias3, bias4) are driven to a logical high value, the voltage drop from VGND to VSS is small compared to any other combination. When only one of the NMOSFETs 210, 212, 214 and 216 is turned on, the voltage drop from VGND to VSS is greater than it would have been with all the NMOSFETs 210, 212, 214 and 216 turned on. The voltage VGND may be controlled by turning on different combinations of the NMOSFETs 210, 212, 214 and 216 in the ground bias circuit 206. The gate SM of NMOSFET 218 in the sleep bias circuit 208 remains off (driven to a logical low value) when the sleep mode (SM) is inactivated.

In this example, when the array 204 is put in the sleep mode, a logical high value is presented on node SM of the sleep bias circuit 208 and a logical low value is applied to nodes bias1, bias2, bias3 and bias4 of the ground bias circuit 206. When a logical high value is applied to node SM, the NMOSFET 218 is turned on. When the NMOSFET 218 is turned on, a voltage drop occurs from VGND to VSS keeping the voltage at node VGND higher than VSS. Because the voltage on node VGND is higher than VSS, less power is consumed in the array 204.

In this example, four NMOSFETs 210, 212, 214 and 216 are used to control the bias on node VGND. However, any number of NMOSFETs may be used. In this example, one NMOSFET 218 was used to control the sleep mode. However, any number of NMOSFETs may be used.

Figure 3:
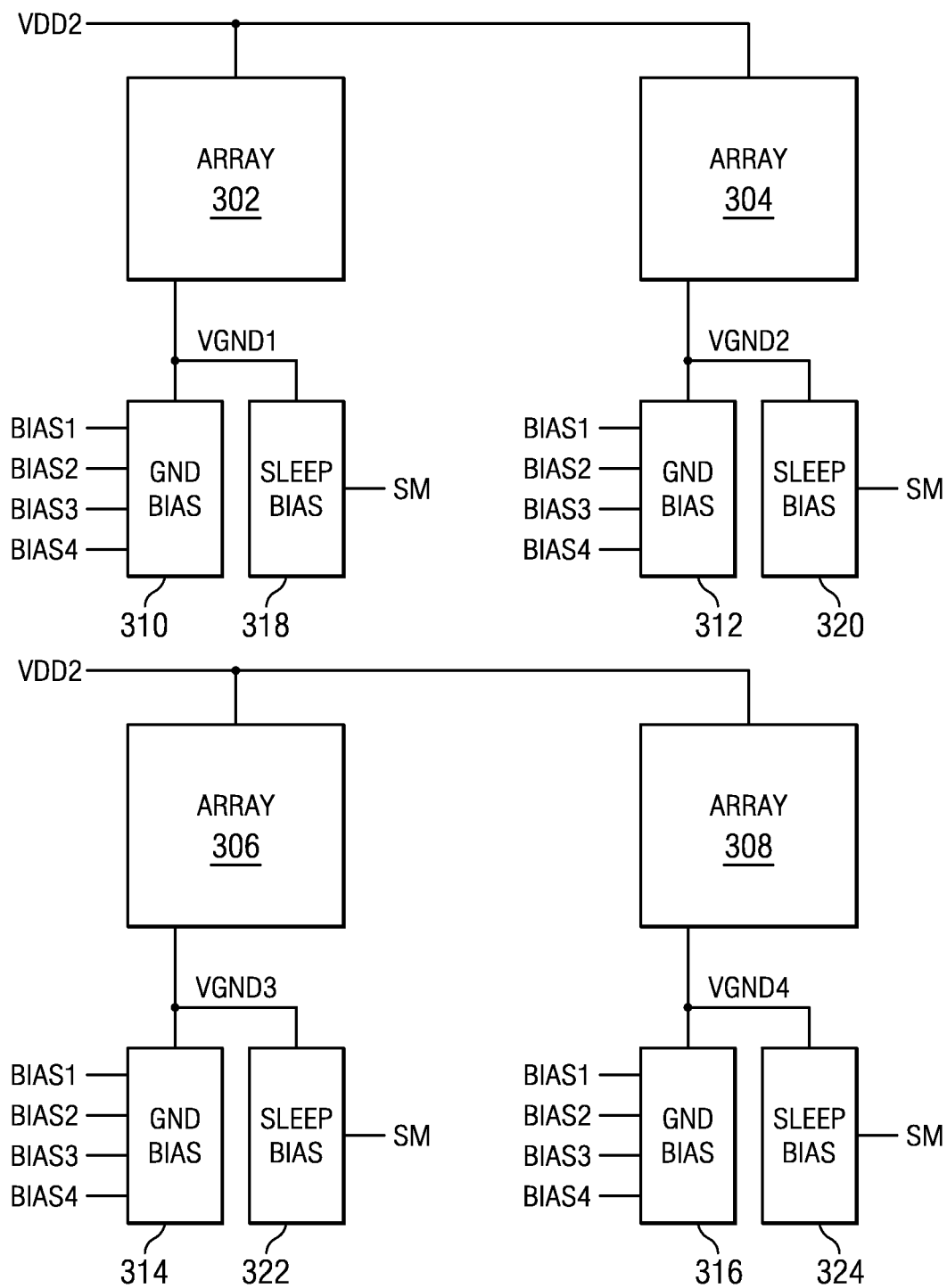
FIG. 3 is a block diagram of an embodiment of four memory arrays with array bias control.

FIG. 2 illustrated an example of one array 204 with a ground bias circuit 206 and a sleep bias circuit 208. However, array 204 may be divided into smaller arrays 302, 304, 306, 308, as shown in FIG. 3. FIG. 3 is a block diagram of an embodiment of four memory arrays 302, 304, 306, 308 with array bias control. In this embodiment each array 302, 304, 306, and 308 has a ground bias circuit 310, 312, 314, 316 respectively and a sleep bias circuit 318, 320, 322, 324 respectively. Each array 302, 304, 306 and 308 operates in the same manner as array 204.

For example, the bias on array 302 is controlled by SM and bias1, bias2, bias3 and bias4. When the array 302 is put in the sleep mode, a logical high value is presented on node SM and a logical low value is presented on nodes bias1, bias2, bias3 and bias4. When a logical high value is applied to node SM and a logical low value is presented on nodes bias1, bias2, bias3 and bias4, an NMOSFET (not shown) is activated in the sleep bias circuit 318. When the NMOSFET is turned on, a voltage drop occurs from VGND1 to VSS keeping the voltage at node VGND1 higher than VSS. Because the voltage on node VGND1 is higher than VSS, less power is consumed in the array 302.

In this example, when the array 302 is not in the sleep mode (L1 program memory 106 is being accessed), a logical low value is presented on node SM and a logical high value is presented on one or more of nodes bias1, bias2, bias3 and bias4. When a logical low value is applied to node SM, the NMOSFET (not shown) is inactivated. When a logical high value is presented on one or more of nodes bias1, bias2, bias3 and bias4, the ground bias circuit 310 is activated. The voltage on node VGND1 may be controlled by turning on different combinations of the NMOSFETs (not shown) in the ground bias circuit 310.

The example shown in FIG. 3 divided the memory array 204 into four parts. However, the memory array 204 may be divided into any number of arrays.

Figure 4:
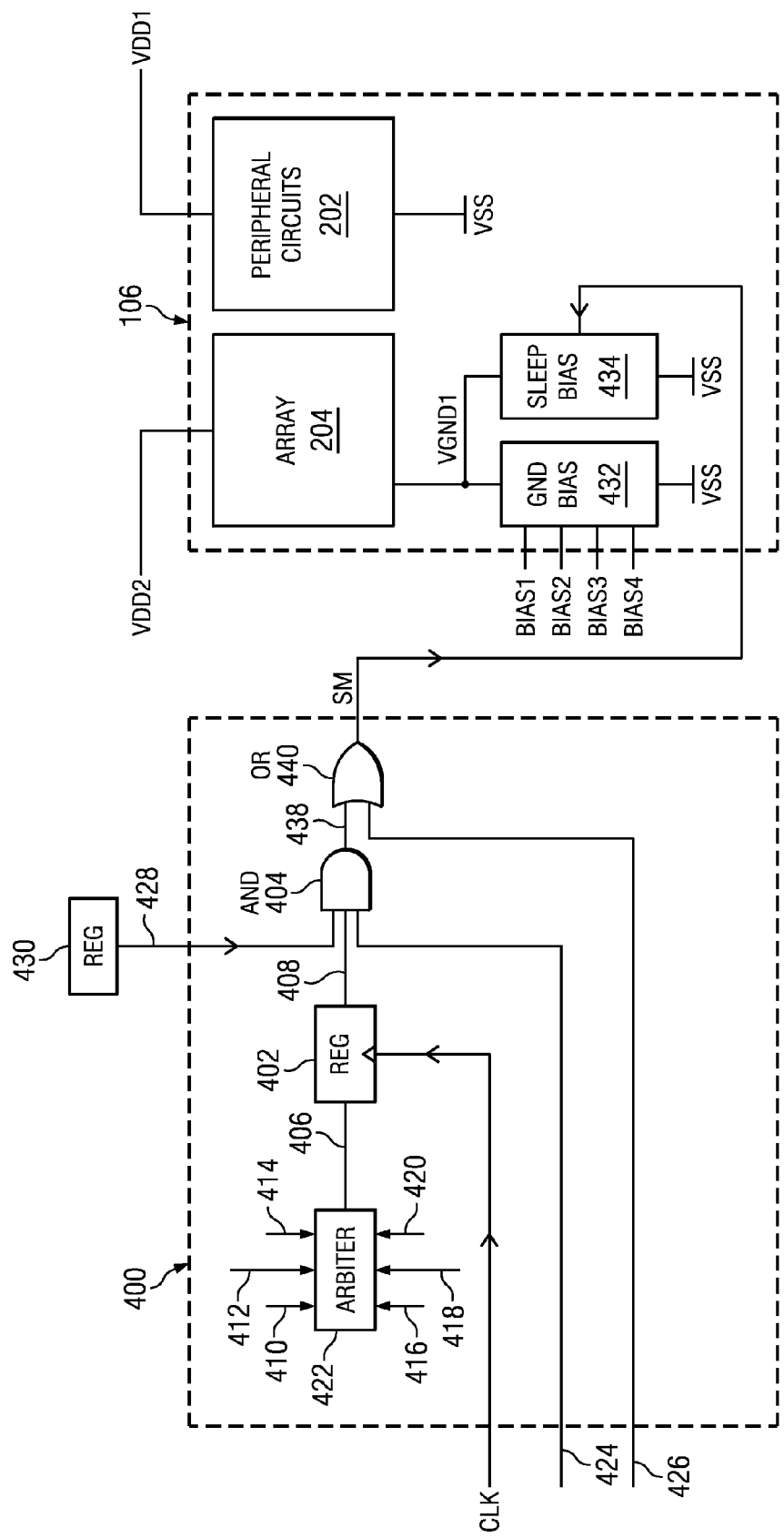
FIG. 4 is a schematic diagram of an embodiment of an L1 program memory with circuitry used to control the sleep mode operation.

FIG. 4 is a schematic diagram of an embodiment of an L1 program memory 106 with control circuitry 400 used to control array bias in the L1 program memory 106. In this embodiment, the control circuitry 400 determines when the L1 program memory 106 may be put into the sleep mode and taken out of the sleep mode. For example, the L1 program memory may be tested in the sleep mode by applying a high logical value to node 426. Because a high logical value is presented to the two-input OR 440, the output SM of the two-input OR 440 is a logical high value. When signal SM is a high logical value, the sleep bias circuit 434 is activated. When the sleep bias circuit 434 is activated, the ground bias circuit 432 is inactivated by applying a logical low value to nodes bias1, bias2, bias3 and bias4.

Node 424 is electrically connected to a pin on a package that contains a CPU with a multi-level memory system 100. When node 424 is driven to a logical low value by the pin, the output 438 of the three-input AND 404 is a logical low value. When signal 438 and signal 426 are low logical values, signal SM is a logical low value. When signal SM is a logical low value, the sleep bias circuit 434 is inactivated. When the sleep bias circuit 434 is inactivated, the ground bias circuit 432 is activated by driving one or more of nodes bias1, bias2, bias3 and bias4 to a logical high value.

The sleep mode may also be enabled/disabled by a memory mapped register bit 430. The memory mapped register bit 430 is controlled by software. One advantage of controlling the memory mapped register bit 430 through software is that an application can choose to enable the sleep mode based on need. For example, when the L1 program memory 106 is switched back and forth between the sleep mode and being out of the sleep mode too frequently, dynamic (switching) power may increase such that more power is consumed switching in and out of the sleep mode than is saved by putting the L1 program memory 106 in the sleep mode. Applications can make use of this information to decide whether power can be saved by using the sleep mode operation or not.

It should be noted that the functionality of the program memory controller 104 is not effected when the sleep mode is enabled or disabled. The leakage power saved versus the dynamic (switching) power used when putting the L1 program memory 106 in the sleep mode is realized without any need to change the end application. As a result, the use of the sleep mode is transparent to the end user.

The arbiter 422 determines whether the L1 program memory 106 will be accessed for a period of time by polling requestors. For example, the arbiter 422 may poll for the following requests: 1) a CPU read 410, 2) a DMA read 412, 3) a DMA write 414, 4) an L2 return data write 416, 5) an emulation read/write 418 and 6) a cache invalidation operation 420. When none of the requestors 410, 412, 414, 416, 418 and 420 need access to the L1 program memory 106 for a period time, node 406 is driven to a logical high value and is stored in register 402. On the next clock cycle, the logical high value is read from register 402 and applied to node 408. When nodes 408, 424 and 428 are logical high values, the output 438 of three-input AND 404 is a logical high value. When output 438 is a high logical value, the output SM of OR 440 is a logical high value and as a result the sleep bias circuit 434 is activated while the GND bias circuit 432 is inactivated.

However, if any one of the requestors 410, 412, 414, 416, 418 or 420 have a request to access the L1 program memory 106, node 406 is driven to a logical low value. On the next clock cycle, the logical low value is read from register 402 and applied to node 408. When node 408 is a logical low value and node 426 is a logical low value, the sleep bias circuit 434 is inactivated while the ground bias circuit 432 is activated. In this example, a three-input AND 404 and a two-input OR were used to implement the necessary logic. However, other logic configurations may be used to realize the same function.

In these examples, the arbiter 422 predetermines whether the sleep mode should be enabled or disabled. The predetermination is done across multiple pipeline stages. This predetermination is done one clock cycle before enabling or disabling the sleep mode. Because the predetermination is done in one clock cycle, the time to predetermine whether the sleep mode should be enabled or disabled can be very short. For example, when the CPU 102 has a clock frequency of 1.2 gigahertz, the time to predetermine whether the sleep mode should be enabled or disabled is 833 picoseconds.

It should be noted that the access to the L1 program memory 106 determines the CPU-to-memory latency and it is often required to maintain latency between CPU 102 and L1 program memory 106 accesses. Addition of the arbiter 422 does not add any additional latency.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A digital computing system comprising:
   a central processing unit operable to perform data processing operations under program control;
   a memory mapped register including a sleep mode enable bit having one of a sleep mode enable state and a sleep mode disable state;
   a L1 program memory connected to said central processing unit storing program code capable of controlling said central processing unit, said central processing unit operable to access said L1 program memory;
   at least one requestor operable to access said L1 program memory;
   an arbitrator connected to said central processing unit and said at least one requestor, said arbitrator generating a sleep mode (SM) signal in an active state for a following memory access cycle when neither said central processing unit nor any of said at least one requestor requests access to said L1 program memory;
   a bias control circuit connected to said L1 program memory and said arbitrator, said bias control circuit supplying a first bias to said L1 program memory for normal operation if said sleep mode (SM) signal is in an inactive state and a second bias to said L1 program memory for reduced power sleep mode operation if said sleep mode (SM) signal is in said active state;
   an AND gate having a first input connected to said arbitrator and receiving said sleep mode signal, a second input connected to said memory mapped register and receiving a state of said sleep mode enable bit, and an output connected to said bias control circuit; and
   said bias control circuit disabling said sleep mode and supplying said L1 program memory said first bias if said sleep mode enable bit has said sleep mode disable state.

2. The digital computing system of claim 1, wherein:
   said at least one requestor includes a direct memory access unit.

3. The digital computing system of claim 1, further comprising:
   a pin connected external to the digital computing system;
   said AND gate has a third input connected to said pin; and
   said bias control circuit disabling said sleep mode and supplying said L1 program memory said first bias if said pin receives a first voltage.

* * * * *